United States Patent
Djeu

(10) Patent No.: US 10,392,721 B1
(45) Date of Patent: Aug. 27, 2019

(54) LASER-HEATED CRYSTAL FIBER GROWTH SYSTEM

(71) Applicant: Nicholas Djeu, Tampa, FL (US)

(72) Inventor: Nicholas Djeu, Tampa, FL (US)

( * ) Notice: Subject to any disclaimer, the term of this patent is extended or adjusted under 35 U.S.C. 154(b) by 0 days.

(21) Appl. No.: 16/036,457

(22) Filed: Jul. 16, 2018

Related U.S. Application Data

(60) Provisional application No. 62/541,668, filed on Aug. 5, 2017.

(51) Int. Cl.
| | |
|---|---|
| *C30B 13/00* | (2006.01) |
| *H01S 3/067* | (2006.01) |
| *C30B 13/22* | (2006.01) |
| *C30B 15/16* | (2006.01) |
| *C30B 15/26* | (2006.01) |

(52) U.S. Cl.
CPC ........... *C30B 13/005* (2013.01); *C30B 13/00* (2013.01); *C30B 13/22* (2013.01); *C30B 15/16* (2013.01); *C30B 15/26* (2013.01); *H01S 3/06716* (2013.01); *Y10T 117/1004* (2015.01); *Y10T 117/1008* (2015.01)

(58) Field of Classification Search
CPC ......... C30B 13/00; C30B 13/22; C30B 15/26; Y10S 117/904; Y10T 117/1004; Y10T 117/1008
See application file for complete search history.

(56) References Cited

U.S. PATENT DOCUMENTS

| | | | |
|---|---|---|---|
| 4,040,890 A | 8/1977 | Burrus, Jr. et al. | |
| 4,048,090 A | 9/1977 | Hannerz | |
| 4,421,721 A * | 12/1983 | Byer | C30B 15/00 |
| | | | 117/202 |
| 4,532,000 A | 7/1985 | Harrington et al. | |
| 5,607,506 A | 3/1997 | Phomsakha et al. | |
| 6,898,011 B2 * | 5/2005 | Kandaka | B82Y 10/00 |
| | | | 359/580 |
| 2007/0166965 A1 * | 7/2007 | Tanaka | B23K 26/0604 |
| | | | 438/487 |
| 2009/0081456 A1 * | 3/2009 | Goyal | C30B 15/34 |
| | | | 428/389 |
| 2010/0263585 A1 * | 10/2010 | Hamada | C30B 15/26 |
| | | | 117/15 |

(Continued)

*Primary Examiner* — Matthew J Song
(74) *Attorney, Agent, or Firm* — Quickpatents, LLC; Kevin Prince

(57) ABSTRACT

A laser heated pedestal growth system includes two lasers having output beams that are combined with a beam combiner to produce a single beam. A growth chamber that includes a final focusing mirror for receiving and focusing the single beam of the lasers onto a tip of a feed material to create a molten zone in a focal region. A feed transport mechanism is adapted for transporting a feed material through the growth chamber and into the molten zone. An opposing seed transport mechanism is adapted for withdrawing a seed material from the growth chamber. An imaging system is adapted for capturing an image of the molten zone within the growth chamber. A controller in communication with the feed transport mechanism, the seed transport mechanism, one of the two lasers, and the imagining system is adapted to control and stabilize a fiber growth process by controlling the feed transport mechanism, the seed transport mechanism, and the power of the combined laser beam.

18 Claims, 4 Drawing Sheets

(56) References Cited

U.S. PATENT DOCUMENTS

| | | | |
|---|---|---|---|
| 2011/0067626 A1* | 3/2011 | Maxwell | C30B 13/24 117/204 |
| 2014/0079363 A1* | 3/2014 | Hsu | G02B 6/036 385/127 |
| 2014/0119692 A1* | 5/2014 | Wang | C03B 37/027 385/40 |
| 2018/0051389 A1* | 2/2018 | Maxwell | C30B 13/24 |

* cited by examiner

LASER-HEATED CRYSTAL FIBER GROWTH SYSTEM

CROSS-REFERENCE TO RELATED APPLICATIONS

This application claims the benefit of the U.S. Provisional Patent Application No. 62/541,668 filed on Aug. 5, 2017, and is incorporated herein by reference.

STATEMENT REGARDING FEDERALLY SPONSORED RESEARCH AND DEVELOPMENT

Not Applicable.

FIELD OF THE INVENTION

This invention relates to the growing of crystalline optical fibers, and particularly to an enhanced laser-heated pedestal crystal fiber growth system.

DISCUSSION OF RELATED ART

The laser heated pedestal growth (LHPG) technique as a method for growing single crystal optical fibers was first invented four decades ago (see U.S. Pat. No. 4,040,890). A major advantage of this technique, compared to other crystalline fiber growth approaches (e.g., edge-defined film-fed growth), is that it does not require a crucible, so that a high degree of purity can be obtained in the grown fiber. Since then, several other versions have been patented (U.S. Pat. Nos. 4,421,721; 5,579,427; and 5,607,506). What these systems all have in common is that a laser is used to provide the heat necessary to melt the starting material (referred to as the feed), which may be either a sintered material or a single crystal to start with. In contrast to the production of conventional silica fibers in which the preform is situated at the top of a tower and the fiber is drawn in the downward direction, in the LHPG technique the feed is located at the bottom and the crystalline fiber is pulled upwards.

With the LHPG approach, a laser beam is focused onto the tip of the feed to create a molten zone first. Next, an oriented seed is lowered into the molten zone until the latter becomes a bridge between the feed and the seed. Then the seed and the feed are both translated upwards. The seed is usually transported faster than the feed, resulting in a diameter reduction for the grown fiber, which will have the same crystalline orientation as the starting seed. This fiber can then be used as the seed in subsequent growths. When the starting material is fully dense and evaporation is negligible, the extent of diameter reduction can be calculated from the equation $vD^2 = Vd^2$, where v and V are the velocities of translational motion of the feed and seed respectively and D and d are the diameters of the feed and the grown fiber respectively. It has been found that the maximum diameter reduction ratio is approximately 3, regardless of the material used. Therefore, to produce a very thin fiber multiple growths are required.

Experience has shown that a major cause of light attenuation in the fiber is the nonuniformity of the diameter of the grown fiber, which leads to scattering loss at the side of the fiber. It has also been found that this diameter nonuniformity is in large part the result of fluctuations in the temperature of the molten zone. Therefore, ways to minimize temperature fluctuation of the molten zone during growth are sought in the pursuit of fibers with good transmissivity. The present disclosure presents several modifications of the LHPG system aimed at this goal.

A second objective of the present invention is the instrumentation of an augmented LHPG system capable of growing tapered fibers. In the case of silica fibers, tapers are made through thermal treatment of the fiber after it has been drawn first in the form of a uniform diameter fiber. In the LHPG process, however, it is possible to grow a tapered fiber without the need of any subsequent treatment. Tapered fibers are useful, for example, in the delivery of high energy laser pulses. The two opposing requirements in this instance are the avoidance of laser damage (which generally occurs at the ends of the fiber and therefore calls for a large diameter at the ends) and the retention of good flexibility (which calls for a small diameter). A doubly-tapered fiber with large diameter ends and a mid-section with smaller diameter presents itself as a solution.

A further improvement on the LHPG system to be described in this disclosure is a novel concept for the transport and guidance of the feed which permits the least waste of feed material consistent with the other requirements for this part of the fiber growth system.

This is clearly an important consideration in the commercial deployment of any LHGP system.

Therefore, there is a need for a system that produces crystal fibers having a high degree of diameter control, allowing uniform-diameter fibers or tapered fibers, as desired. Such a needed invention would be relatively reliable and require little maintenance, and would minimize waste of feed material. The present invention accomplishes these objectives.

SUMMARY OF THE INVENTION

The present invention provides a number of significant improvements over the LHPG system disclosed in U.S. Pat. No. 5,607,506. To facilitate the discussion, the overall growth system can be divided into five subsystems: the laser power delivery subsystem, the growth chamber, the feed transport mechanism, the seed (and grown fiber) transport mechanism, and the growth visualization subsystem. Additionally, a computer controller is used to coordinate the operations of the various subsystems. In the actualization of the enhancements to the fiber growth system disclosed herein, substantive changes to four of these subsystems have been made.

To reduce diameter fluctuation in the grown fiber, major alterations to the laser power delivery subsystem, the growth chamber, and the growth visualization subsystem are necessary. Specifically, instead of using a single $CO_2$ laser, the output from two $CO_2$ lasers with approximately equal power are combined into a single beam before being directed into a growth chamber. The rationale is that the power fluctuation of the combined beam in terms of percentage is less than that of each individual laser's, since an averaging effect tends to smooth out the peaks and valleys due to their random nature in the individual beams.

Additionally, a focusing mirror within the growth chamber is intentionally chosen to have a poor surface finish in order to produce a softer focus in a molten zone of the growth chamber, so that inevitable lateral wandering of the feed during growth results in less temperature fluctuation within the molten zone. The net effect of these two measures is that not only does the growth become more stable, but the maximum growth speed possible is also increased (in the case of sapphire fibers from 3 mm/min to more than 6 mm/min).

Finally, a growth stabilization algorithm is introduced to allow active control of the growth process. This control can be affected either automatically or manually by monitoring a maximum brightness of the molten zone displayed on a computer screen.

The second important innovation, namely the enabling of the LHPG system to grow tapered fibers, entails the simultaneous programmed adjustments of the velocity(ies) of the feed/seed driver(s) and the power delivered by one of the lasers during the growth of tapered sections. To increase the diameter reduction ratio in a taper, for example, one would decrease the speed of the feed for constant seed speed and at the same time decrease the laser power. The opposite adjustments are made if a decrease in the diameter reduction ratio is desired.

Lastly, a new design has been invented for the transport and guidance of the feed. In U.S. Pat. No. 5,607,506 the feed is transported by a steel roller and a rubber cylinder, and guided by a metal capillary. Such a feed can be contaminated through contact with the capillary, especially when the side of the feed is rough (as when the starting feed is not side polished). More problematic is the fact that the distance between where the feed is held (i.e., the contact point of the roller with the cylinder) and the molten zone must be kept quite large to avoid overheating of the rubber, thus wasting feed material. These difficulties are largely overcome by the use of a novel sapphire orifice guide and a lead screw drive for the transport of the feed.

The enhanced laser heated pedestal growth (LHPG) system includes two lasers having output beams that are combined with a beam combiner to produce a single beam. Preferably each laser is mutually orthogonally polarized, the beam combiner being a polarization beam combiner. The growth chamber includes a final focusing mirror for receiving and focusing the single beam of the lasers onto a tip of a feed material to create a molten zone in a focal region. The feed transport mechanism is adapted for transporting a feed material through the growth chamber and into the molten zone.

The imaging system is adapted for capturing an image of the molten zone within the growth chamber. As part of the imaging system, the images are directed via relay mirrors into a long distance microscope coupled to a CCD camera for display on a computer screen. While both images are displayed to enable the orthogonal lateral adjustments of the feed, only one of them is analyzed and made use of by the computer program.

The opposing seed transport mechanism is adapted for withdrawing a seed material from the growth chamber. Inside an aluminum seed transport enclosure is a pair of rubber rollers which are mounted via ball bearings in a composite roller, with one roller mounted in its stationary part and the other roller mounted in a spring-loaded movable part.

A controller in communication with the feed transport mechanism, the seed transport mechanism, and the imagining system is adapted to control and stabilize a fiber growth process by controlling the feed transport mechanism and the seed transport mechanism. Preferably the controller includes a CPU and a feedback-driven program that enables the programmer to vary the speeds of translation for both the feed transport mechanism and the seed transport mechanism. The controller also preferably includes an algorithm in the program for determining a maximum brightness point in the two-dimensional image of the molten zone produced by the imaging system.

Preferably the output beams of the two lasers are each passed through one of two electronically controllable power attenuators, each of which is in communication with the controller. As such the controller further controls and stabilizes the fiber growth process by controlling the intensity of the laser output beams via the power attenuators. The measured brightness of the maximum brightness point is controlled by the controller through a feedback loop to the power attenuator of one of the lasers to stabilize the maximum brightness point about a preselected value.

The controller is preferably able to control the speed of translation for both the feed transport mechanism and the seed transport mechanism, as well as the maximum brightness of the maximum brightness point of the molten zone, to produce tapered fibers.

The present invention is a system that produces crystal fibers having a high degree of diameter control, allowing uniform-diameter fibers or tapered fibers, as desired. The present system is relatively reliable and require little maintenance, and minimizes waste of feed material. Other features and advantages of the present invention will become apparent from the following more detailed description, taken in conjunction with the accompanying drawings, which illustrate, by way of example, the principles of the invention.

DETAILED DESCRIPTION OF THE PREFERRED EMBODIMENT

Illustrative embodiments of the invention are described below. The following explanation provides specific details for a thorough understanding of and enabling description for these embodiments. One skilled in the art will understand that the invention may be practiced without such details. In other instances, well-known structures and functions have not been shown or described in detail to avoid unnecessarily obscuring the description of the embodiments.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, shall refer to this application as a whole and not to any particular portions of this application. When the claims use the word "or" in reference to a list of two or more items, that word covers all of the following interpretations of the word: any of the items in the list, all of the items in the list and any combination of the items in the list. When the word "each" is used to refer to an element that was previously introduced as being at least one in number, the word "each" does not necessarily imply a plurality of the elements, but can also mean a singular element.

Figure 1:
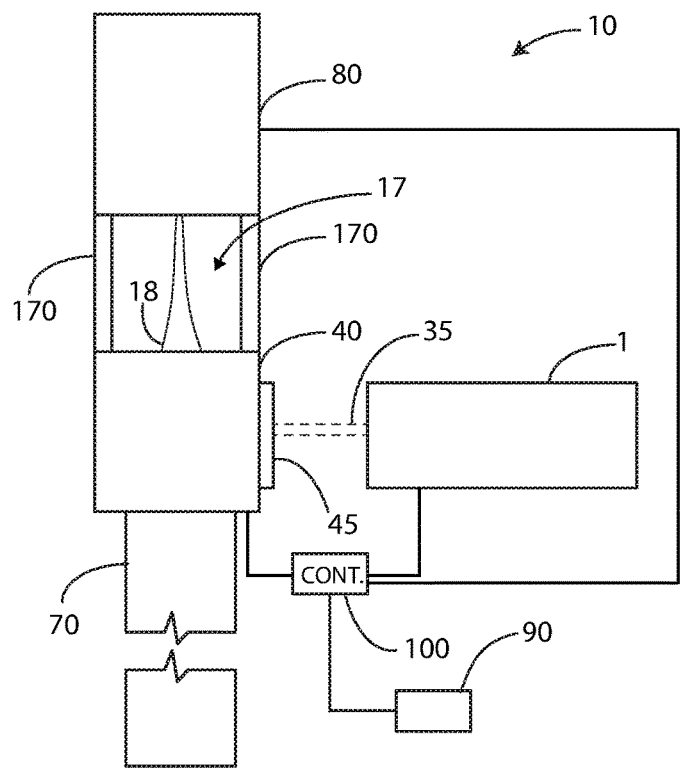
FIG. 1 is a side diagram in block diagram form showing relative positions of various subsystems of the enhanced laser heated pedestal growth system.
Figure 2:
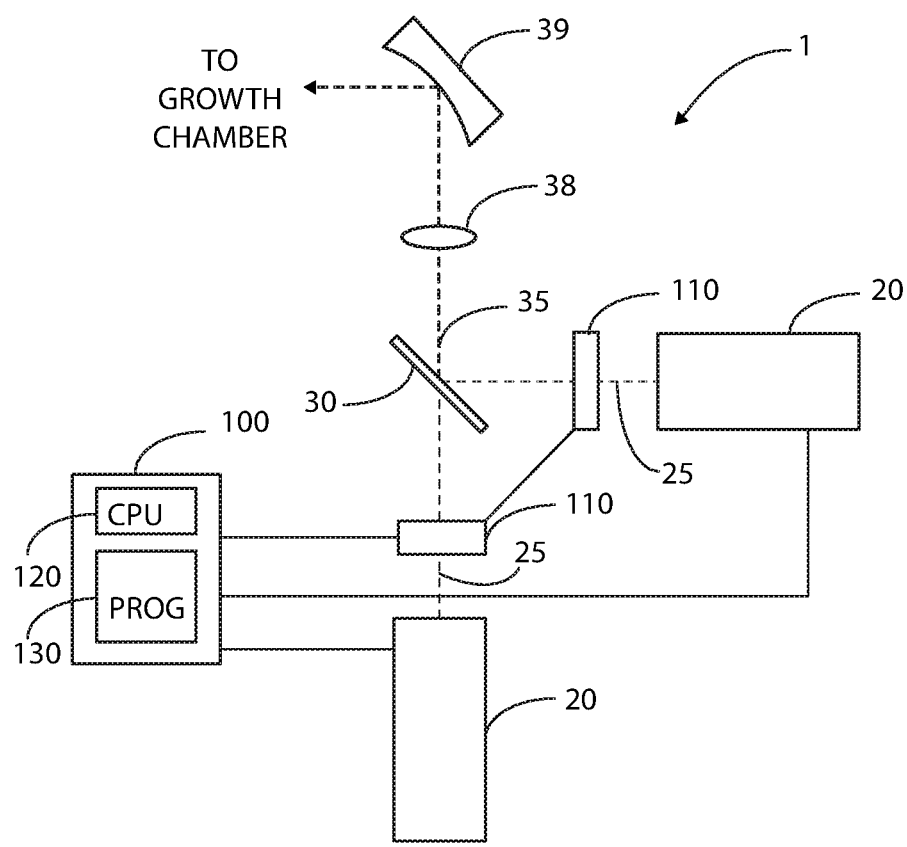
FIG. 2 is a top diagram of a laser power delivery subsystem.

FIGS. 1 and 2 illustrate an enhanced laser heated pedestal growth (LHPG) system 10. Two lasers 20 having output beams 25 are combined with a beam combiner 30 to produce a single beam 35. Preferably each laser 20 is mutually orthogonally polarized, the beam combiner 30 being a polarization beam combiner 30.

FIG. 1 is a side view in block diagram form of the various parts of the preferred embodiment of the enhanced LHPG system 10, showing their relative positions with a feed transport mechanism 70 and seed transport mechanism 80 situated below and above, respectively, a growth chamber 40. While the feed transport mechanism 70 is directly attached to the growth chamber 40, the seed transport mechanism 80 is preferably separated from the growth chamber 40 by support rods 170 so as to provide a sufficient distance between a contact point of a seed fiber within the seed transport mechanism 80 and a molten zone within the growth chamber 40 to make a self-centering force of the molten zone operative (see U.S. Pat. No. 5,607,506). Not shown in the diagram is a long-distance microscope and ancillary accessories for the observation of the molten zone, all part of an imaging system 90.

A top view for the laser power delivery subsystem 1 is shown in FIG. 2. An output from two preferably $CO_2$ lasers 20, with orthogonally polarized beams 25, are first passed through variable attenuators 110. In one embodiment, one of the attenuators 110 can be manually adjusted, while the other attenuator 110 is controlled via a computer program 130. The two laser beams 25 are made to have approximately equal power and then combined at the polarization beam combiner 30. A combined beam 35, after passing through a focusing lens 38, is intercepted by an off-axis parabolic mirror 39 positioned in a divergent part of the beam (i.e., after the focus) and made into a collimated beam with a diameter of approximately 5 cm. This beam is then directed into the growth chamber 40.

The growth chamber 40 (FIGS. 1 and 3) includes a final focusing mirror 50 for receiving and focusing the single beam 35 of the lasers 20 onto a tip of a feed material 15 to create a molten zone in a focal region 60. Preferably the growth chamber 40 further includes a feed guide 230 (FIG. 6) that comprises a pair of sapphire orifices 231,232 separated by a distance of between 2 cm and 4 cm.

Figure 3:
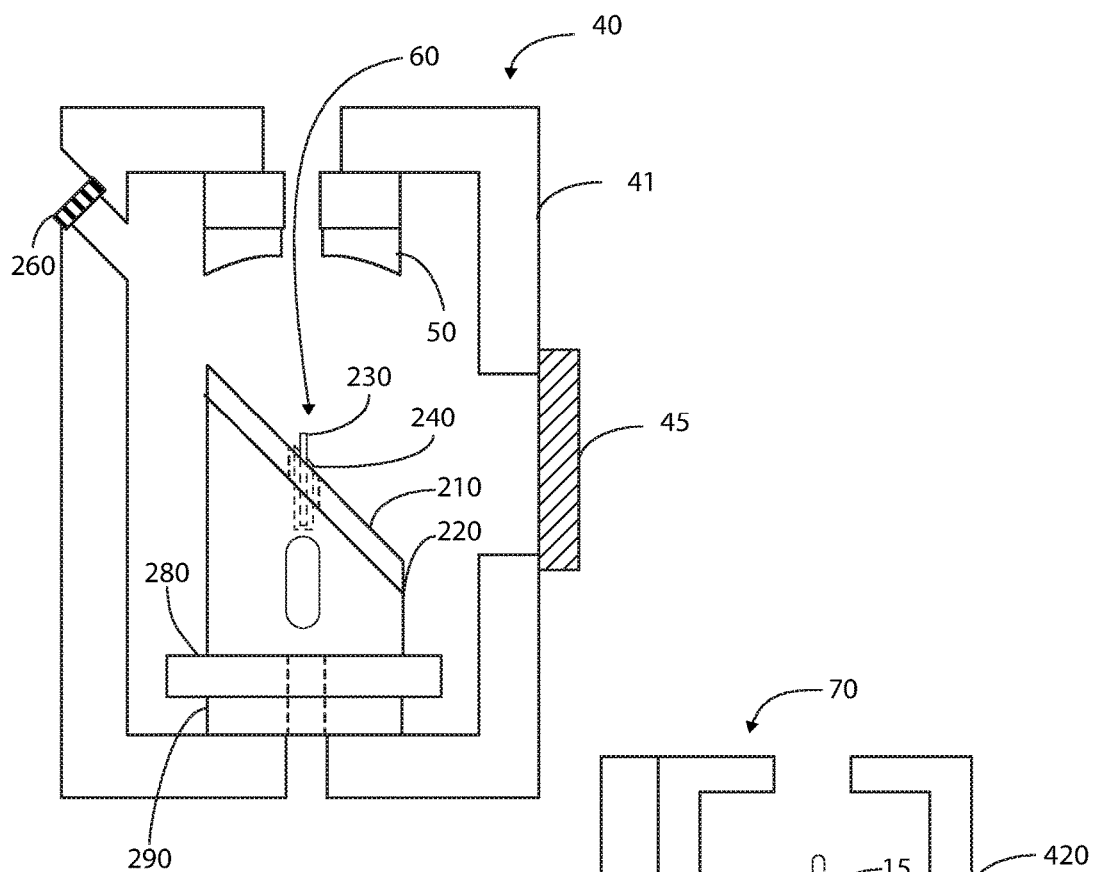
FIG. 3 is a cross-sectional diagram view of a growth chamber.

As seen in FIG. 3, the growth chamber 40 has an outer aluminum enclosure 41. The collimated combined laser beam 35, after passing through an entrance window 45, impinges upon scraper mirror 210, which reflects the beam 35 upwards onto final focusing mirror 50. In the preferred embodiment the final focusing mirror 50 is intentionally made to have a relatively poor surface accuracy of approximately 0.1 of a wave RMS (i.e., 1 micrometer for $CO_2$ lasers) in order to produce a softer focus in the molten zone situated in the vicinity of the focal region 60.

Figure 6:
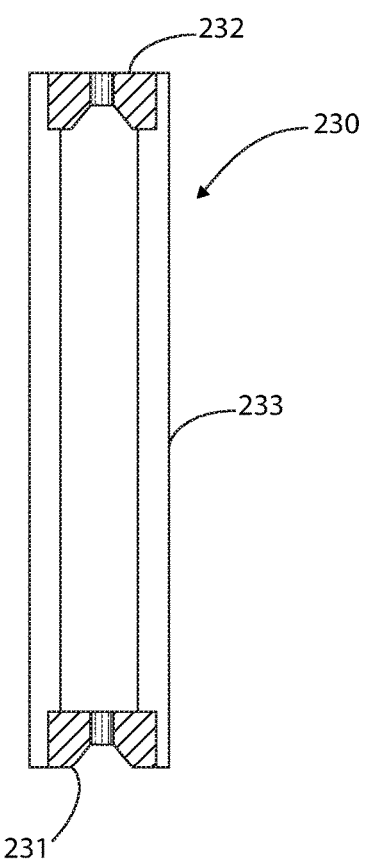
FIG. 6 is a cross sectional view of a feed guide.

The feed transport mechanism 70 (FIGS. 1 and 5) is adapted for transporting a feed material 15 through the growth chamber 40 and into the molten zone. The feed material 15 is guided by interchangeable feed guide 230 secured inside receptacle 240. The outside diameter of the interchangeable feed guide 230 is sized to just fit into the receptacle 240. A detailed sketch of the feed guide is shown in FIG. 6, which comprises a stainless steel tube 233 and a pair of sapphire orifices 231 and 232 with the same bore diameter. Since the bore diameter can be selected in 0.025 mm steps, for a given feed diameter the amount of "play" for the feed material 15 within the guide 230 is never greater than that distance. Since the starting feed material 15 has a diameter of just over 1 mm that represents just a 2% undersize at most. Subsequent feed material 15 can be grown to fit almost exactly the sapphire orifices 231,232. Sapphire can not only withstand very high temperatures, but is especially attractive for growing sapphire fibers because it eliminates the possibility of any contamination of the feed. The length of a stainless steel tube is approximately 3 cm, and the unusable part of the feed material 15 is only slightly longer than that.

The scraper mirror 210 is secured onto an aluminum block 220 with a 45-degree angled top, which in turn is mounted on orthogonally oriented motorized translation stages 280 and 290. These stages 280,290 enable the precise lateral positioning of the feed material 15 with respect to the focus of the combined laser beam 35. The molten zone is monitored through first viewing window 260 and a second viewing window above the plane of the figure (not shown).

The imaging system 90 is adapted for capturing an image of the molten zone within the growth chamber 40. As part of the imaging system 90, the images are directed via relay mirrors (not shown) into a long distance microscope coupled to a CCD camera for display on a computer screen (not shown). While both images are displayed to enable the orthogonal lateral adjustments of the feed, only one of them is analyzed and made use of by the computer program 130.

Figure 5:
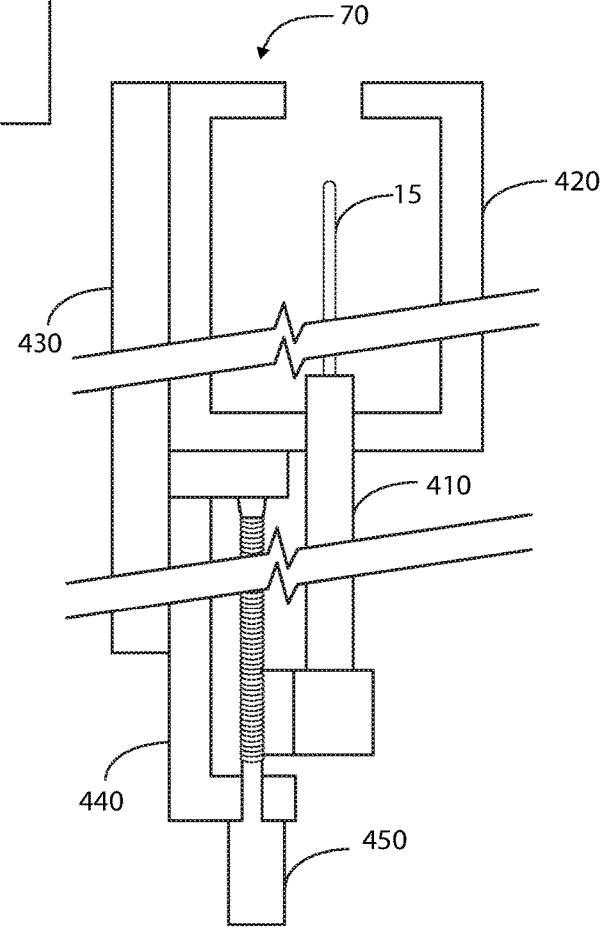
FIG. 5 is a cross-sectional diagram of a feed transport subsystem viewed from the rear.

The precise vertical positioning and controlled motion of the feed is provided by the feed transport mechanism shown in FIG. 5. It comprises of an aluminum feed housing 420 that can be opened from the back (with respect to the entrance window 45) for the placement of the feed material 15 and a lead screw 440, attached to a mounting plate 430. A stainless steel pedestal rod 410 is attached to the nut block of the lead screw, and is made to be coaxial with the feed guide 230 which resides in the growth chamber 40. At the beginning of a fiber growth run, an appropriate feed material 15, is placed at the top of the pedestal rod 410 and made to go through the feed guide 230 in the growth chamber 40 to ready the growth process. The lead screw 440 is driven by a first DC servomotor 450 controlled by the controller 100.

Figure 4:
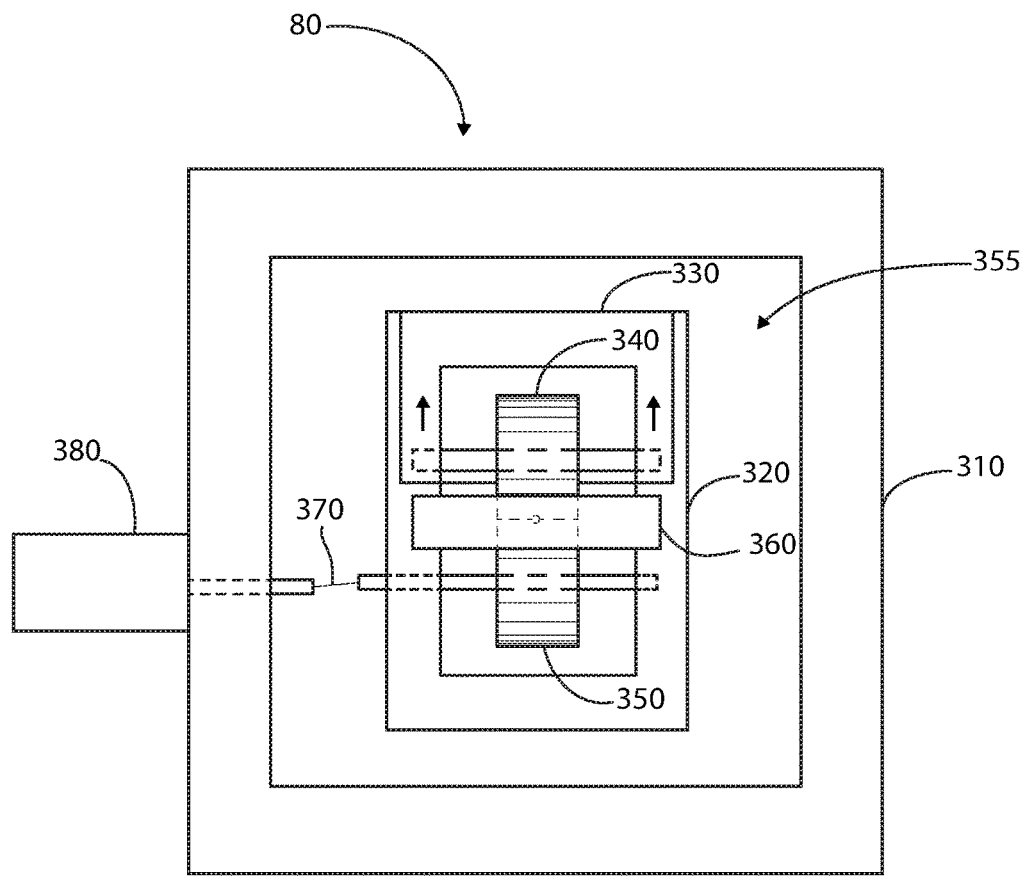
FIG. 4 is a top diagram of a seed transport subsystem with a cover removed.

The opposing seed transport mechanism 80 (FIGS. 1 and 4) is adapted for withdrawing a seed material 17 from the growth chamber 40. Inside an aluminum seed transport enclosure 310 is a pair of rubber rollers 340 and 350 mounted via ball bearings in a composite roller 355, with roller 350 mounted in its stationary part 320 and roller 340 mounted in a spring-loaded movable part 330. FIG. 4 shows the rollers 340 and 350 in the closed position (i.e., contacting each other). When loading the seed fiber material 17, the movable part of the roller 355 is moved back in the direction of the arrows to allow the insertion of the seed material 17 and then returned to the closed position once the bottom of the seed material 17 is at the same height as the top of the feed. A horizontal alignment with the feed material 15 is accomplished by a pair of orthogonally oriented motorized translation stages underneath the stationary part of the roller fixture 320 not visible from the top. A guide plate 360 at the top of the stationary part of the roller fixture 320, having a small aperture directly above the middle of the rollers 340 and 350 in the closed position, facilitates the loading of the seed fiber material 17. Roller 350 is driven by second DC servomotor 380 via a flexible coupler 370.

A controller 100 in communication with the power delivery subsystem 1, the feed transport mechanism 70, the seed transport mechanism 80, and the imagining system 90 is adapted to control and stabilize a fiber growth process by controlling the feed transport mechanism 70 and the seed transport mechanism 80. Preferably the controller 100 includes a CPU 120 and a feedback-driven program 130 that includes programmer specified speeds of translation for both the feed transport mechanism 70 and the seed transport mechanism 80. The controller 100 also preferably includes an algorithm in the program 130 for determining a maximum brightness point in the two-dimensional image of the molten zone produced by the imaging system 90.

Central to the ability of the program 130 to produce high quality fibers is a reliable algorithm to determine the brightness of the maximum brightness point in the molten zone image acquired. An image processing routine of the program 130 is able to find the axis of symmetry for the molten zone first, and then determine the maximum brightness along this axis. Then by using a feedback control loop and the variable attenuator 110 for one of the $CO_2$ lasers, the controller 100 is able to stabilize the maximum brightness to a preselected value within a specified band of deviation. In the preferred embodiment, the controller 100 allows linear variations in the diameter of the fiber being grown and independent linear variations in the speed at which it is being grown. Since the diameter of the feed 15 is fixed, the instantaneous speed at which the feed must be pushed into the molten zone is calculated from $v=(d/D)^2 V$, where d and V are independent variables. In addition, the power transmitted by one of the laser attenuators 110 can be programmed to change during growth as well. The programmable variation in laser power is an essential feature for the growth of tapered fibers 18, since less power is needed when the fiber being grown gets thinner and more power when it gets thicker (as shown in FIG. 1 with exaggerated widths). By dividing the taper into a number of segments, profiles other than a linear profile can also be accommodated.

Preferably the output beams 25 of the two lasers 20 are each passed through one of two electronically controllable power attenuators 110, each of which is in communication with the controller. As such the controller 100 further controls and stabilizes the fiber growth process by controlling the intensity of the laser output beams 25 via the power attenuators 110. A brightness measurement of the maximum brightness point is controlled by the controller 100 through a feedback loop to the power attenuator 110 of one of the lasers 20 so as to stabilize the maximum brightness point about a preselected value.

The controller 100 is preferably able to control the speed of translation for both the feed transport mechanism 70 and the seed transport mechanism 80, as well as the maximum brightness of the maximum brightness point of the molten zone, to produce tapered fibers 18 (FIG. 1).

While a particular form of the invention has been illustrated and described, it will be apparent that various modifications can be made without departing from the spirit and scope of the invention. Accordingly, it is not intended that the invention be limited, except as by the appended claims.

Particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention.

The above detailed description of the embodiments of the invention is not intended to be exhaustive or to limit the invention to the precise form disclosed above or to the particular field of usage mentioned in this disclosure. While specific embodiments of, and examples for, the invention are described above for illustrative purposes, various equivalent modifications are possible within the scope of the invention, as those skilled in the relevant art will recognize. Also, the teachings of the invention provided herein can be applied to other systems, not necessarily the system described above. The elements and acts of the various embodiments described above can be combined to provide further embodiments.

All of the above patents and applications and other references, including any that may be listed in accompanying filing papers, are incorporated herein by reference. Aspects of the invention can be modified, if necessary, to employ the systems, functions, and concepts of the various references described above to provide yet further embodiments of the invention.

Changes can be made to the invention in light of the above "Detailed Description." While the above description details certain embodiments of the invention and describes the best mode contemplated, no matter how detailed the above appears in text, the invention can be practiced in many ways. Therefore, implementation details may vary considerably while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated.

While certain aspects of the invention are presented below in certain claim forms, the inventor contemplates the various aspects of the invention in any number of claim forms. Accordingly, the inventor reserves the right to add additional claims after filing the application to pursue such additional claim forms for other aspects of the invention.

What is claimed is:

1. An enhanced laser heated pedestal growth system comprising:
    two lasers having output beams that are combined with a beam combiner to produce a single beam, wherein a power fluctuation of the single beam is less than that of the output beams of the two lasers individually;
    a growth chamber including a final focusing mirror for receiving and focusing the single beam of the lasers onto a tip of a feed material to create a molten zone in a focal region, wherein the final focusing mirror of the growth chamber has a surface accuracy of approximately 1 micrometer RMS;
    a feed transport mechanism adapted for transporting a feed material through the growth chamber and into a focal region;
    an opposing seed transport mechanism adapted for withdrawing a seed material out of the growth chamber;
    an imaging system adapted for capturing an image of the molten zone within the growth chamber; and
    a controller in communication with the feed transport mechanism, the seed transport mechanism, and the imaging system, the controller adapted to control and stabilize a fiber growth process by controlling the feed transport mechanism and the seed transport mechanism.

2. The system of claim 1 wherein the output beams of two lasers are mutually orthogonally polarized, and wherein the beam combiner is a polarization beam combiner.

3. The system of claim 2 wherein the output beams of the two lasers are each passed through one of two electronically controllable power attenuators, each power attenuator in communication with the controller, wherein the controller further controls and stabilizes the fiber growth process by controlling the intensity of one of the laser output beams.

4. The system of claim 1 wherein the controller includes an algorithm for determining a maximum brightness point in a two-dimensional image of the molten zone produced by the imaging system.

5. The system of claim 4 wherein the brightness of the maximum brightness point is controlled by the controller through a feedback loop to the power attenuator for one of the lasers so as to stabilize the maximum brightness point about a preselected value.

6. The system of claim 5 wherein the controller includes a CPU and a feedback-driven program that includes programmable speeds of translation for both the feed transport mechanism and the seed transport mechanism.

7. The system of claim 6 wherein the controller is able to control the speeds of translation for both the feed transport mechanism and the seed transport mechanism, and to control the maximum brightness of the molten zone, to produce tapered fibers.

8. The system of claim 1 wherein the controller includes a CPU and a feedback-driven program that includes programmable speeds of translation for both the feed transport mechanism and the seed transport mechanism.

9. The system of claim 1 wherein the growth chamber further includes a feed guide that comprises a pair of sapphire orifices separated by a distance of between 2 cm and 4 cm.

10. The system of claim 1, wherein the two lasers are each of the same type of laser.

11. An enhanced laser heated pedestal growth system comprising:
two lasers having output beams that are combined with a beam combiner to produce a single beam;
a growth chamber including a final focusing mirror for receiving and focusing the single beam of the lasers onto a tip of a feed material to create a molten zone in a focal region, wherein the final focusing mirror of the growth chamber has a surface accuracy of approximately 1 micrometer RMS;
a feed transport mechanism adapted for transporting a feed material through the growth chamber and into a focal region;
an opposing seed transport mechanism adapted for withdrawing a seed material out of the growth chamber;
an imaging system adapted for capturing an image of the molten zone within the growth chamber; and
a controller in communication with the feed transport mechanism, the seed transport mechanism, and the imaging system, the controller adapted to control and stabilize a fiber growth process by controlling the feed transport mechanism and the seed transport mechanism, wherein
the output beams of the two lasers are each passed through one of two electronically controllable power attenuators, each power attenuator in communication with the controller, wherein the controller further controls and stabilizes the fiber growth process by controlling the intensity of one of the laser output beams.

12. The system of claim 11 wherein the output beams of two lasers are mutually orthogonally polarized, and wherein the beam combiner is a polarization beam combiner.

13. The system of claim 11 wherein the growth chamber further includes a feed guide that comprises a pair of sapphire orifices separated by a distance of between 2 cm and 4 cm.

14. An enhanced laser heated pedestal growth system comprising:
two lasers having output beams that are combined with a beam combiner to produce a single beam;
a growth chamber including a final focusing mirror for receiving and focusing the single beam of the lasers onto a tip of a feed material to create a molten zone in a focal region;
a feed transport mechanism adapted for transporting a feed material through the growth chamber and into a focal region;
an opposing seed transport mechanism adapted for withdrawing a seed material out of the growth chamber;
an imaging system adapted for capturing an image of the molten zone within the growth chamber; and
a controller in communication with the feed transport mechanism, the seed transport mechanism, and the imaging system, the controller adapted to control and stabilize a fiber growth process by controlling the feed transport mechanism and the seed transport mechanism, wherein
the final focusing mirror of the growth chamber has a surface accuracy of approximately 1 micrometer RMS.

15. The system of claim 14 wherein the output beams of two lasers are mutually orthogonally polarized, and wherein the beam combiner is a polarization beam combiner.

16. The system of claim 14 wherein the output beams of the two lasers are each passed through one of two electronically controllable power attenuators, each power attenuator in communication with the controller, wherein the controller further controls and stabilizes the fiber growth process by controlling the intensity of one of the laser output beams.

17. The system of claim 14 wherein the controller includes a CPU and a feedback-driven program that includes programmable speeds of translation for both the feed transport mechanism and the seed transport mechanism.

18. The system of claim 14 wherein the growth chamber further includes a feed guide that comprises a pair of sapphire orifices separated by a distance of between 2 cm and 4 cm.

* * * * *